(12) United States Patent
Oi (10) Patent No.: US 9,018,534 B2
(45) Date of Patent: Apr. 28, 2015

(54) METHOD OF MANUFACTURING POWER MODULE SUBSTRATE AND POWER MODULE SUBSTRATE

(76) Inventor: Sotaro Oi, Saitama (JP)

(*) Notice: Subject to any disclaimer, the term of this patent is extended or adjusted under 35 U.S.C. 154(b) by 229 days.

(21) Appl. No.: 13/447,483

(22) Filed: Apr. 16, 2012

(65) Prior Publication Data

US 2012/0267149 A1   Oct. 25, 2012

(30) Foreign Application Priority Data

Apr. 20, 2011   (JP) ................................ 2011-93788
Aug. 10, 2011   (JP) ............................... 2011-175282

(51) Int. Cl.
*H05K 1/03*   (2006.01)
*H01L 23/373*   (2006.01)
(Continued)

(52) U.S. Cl.
CPC ........ *H01L 23/3735* (2013.01); *H01L 21/4807* (2013.01); *C04B 37/026* (2013.01); *H01L 21/4857* (2013.01); *C04B 35/645* (2013.01); *H05K 1/0306* (2013.01); *C04B 2237/121* (2013.01); *C04B 2237/343* (2013.01); *C04B 2237/365* (2013.01); *C04B 2237/366* (2013.01); *C04B 2237/402* (2013.01); *C04B 2237/62* (2013.01); *C04B 2237/84* (2013.01); *C04B 2237/86* (2013.01); *H01L 2924/00013* (2013.01); *C04B 2235/6567* (2013.01); *C04B 2235/6581* (2013.01); *C04B 2237/124* (2013.01); *C04B 2237/125* (2013.01); *C04B 2237/126* (2013.01); *C04B 2237/128* (2013.01);
(Continued)

(58) Field of Classification Search
CPC ................ H05K 1/0306; H05K 1/115; H05K 2201/017; H05K 2201/041; H05K 3/0094; H05K 3/4617
USPC ........................................... 174/255; 361/795
See application file for complete search history.

(56) References Cited

U.S. PATENT DOCUMENTS

| 5,285,352 | A | 2/1994 | Pastore et al. |
| 6,734,375 | B2 * | 5/2004 | Kawakita et al. ............ 174/264 |
| 2008/0016685 | A1 * | 1/2008 | Ohara et al. .................... 29/825 |

FOREIGN PATENT DOCUMENTS

| JP | 06-097331 A | 4/1994 |
| JP | 09-307231 A | 11/1997 |

(Continued)

OTHER PUBLICATIONS

Office Action mailed Jan. 20, 2015, issued for the corresponding Japanese patent application No. 2011-175282 and English translation thereof.

*Primary Examiner* — Jeremy C Norris
(74) *Attorney, Agent, or Firm* — Locke Lord LLP; James E. Armstong, IV; George N. Chaclas (57) ABSTRACT

A method of manufacturing a power module substrate in which a plurality of ceramic substrates and metal plates are alternately laminated, and bonded, and the metal plates on both sides of the ceramic substrates are in a connected state through penetration holes formed in the ceramic substrate, wherein, when the ceramic substrates and the metal plates are laminated, columnar metallic members that are longer than the penetration holes are inserted into the penetration holes in the ceramic substrate, and, when the ceramic substrates and the metal plates are bonded, the metallic members are pressurized and plastically deformed so that the metal plates on both sides of the ceramic substrates are bonded through the metallic members.

10 Claims, 10 Drawing Sheets

(51) Int. Cl.
   *H01L 21/48* (2006.01)
   *C04B 37/02* (2006.01)
   *C04B 35/645* (2006.01)
(52) U.S. Cl.
   CPC .... *C04B 2237/407* (2013.01); *C04B 2237/704* (2013.01); *C04B 2237/706* (2013.01); *C04B 2237/708* (2013.01); *H01L 2924/0002* (2013.01)

(56) References Cited

FOREIGN PATENT DOCUMENTS

| | | |
|---|---|---|
| JP | 4311303 B2 | 3/2006 |
| JP | 4565249 B2 | 3/2006 |
| JP | 2007-109697 A | 4/2007 |

\* cited by examiner

METHOD OF MANUFACTURING POWER MODULE SUBSTRATE AND POWER MODULE SUBSTRATE

TECHNICAL FIELD

The present invention relates to a method of manufacturing a power module substrate used in a semiconductor apparatus that controls a large electric current and a large voltage and a power module substrate.

BACKGROUND ART

As a power module of the related art, a power module having a configuration in which a metal plate that forms a conductive pattern layer is laminated on one surface of a ceramic substrate, electronic parts, such as semiconductor chips, are soldered on the conductive pattern layer, a metal plate that becomes a heat dissipation layer is formed on the other surface of the ceramic substrate, and a heat sink is bonded to the heat dissipation layer is known.

In a power module substrate used for the power module, a metal plate is bonded to a surface of a ceramic substrate through brazing. For example, in Patent Document 1, heating is carried out in a state in which a brazing foil is temporarily fixed to a surface of a ceramic substrate through the surface tension of a volatile organic medium, and a conductive pattern layer punched out from a base material is temporarily fixed to the surface of the brazing foil so as to volatilize the volatile organic medium, and the resultant is pressurized in the thickness direction, thereby forming a power module substrate having a metal plate and the ceramic substrate brazed thereto.

Meanwhile, for this kind of power module substrate, there is a demand to have a function of a wiring substrate in addition to a function of an insulating substrate and a function of a heat dissipating substrate in accordance with the recently increasing integration, and therefore multi-layering is being studied.

For example, in the metal and ceramic-bonded substrate (power module substrate) as disclosed in Patent Document 2, a plurality of ceramic substrates having penetration holes as via holes formed therein and aluminum metal plates interposed between the ceramic substrates are provided in a multilayer structure. In this case, the metal plates are formed by feeding and solidifying molten metal between the ceramic substrates that are laminated in a casting mold, and therefore the molten metal is fed and solidified in the penetration holes that are formed in the ceramic substrates so that the metal plates on both sides of the ceramic substrates are electrically connected to each other through the metal in the penetration holes.

RELATED ART DOCUMENT

Patent Document

[Patent Document 1] Japanese Patent No. 4311303
[Patent Document 2] Japanese Patent No. 4565249

DISCLOSURE OF THE INVENTION

Problem that the Invention is to Solve

However, in the method as described in Patent Document 2 in which the substrate is manufactured by feeding the molten metal, when the metal filled in the penetration holes in the ceramic substrates is thermally expanded and shrunk repeatedly due to a temperature cycle, there is a problem in that separation between the metal and the ceramic substrates occurs, or cracking occurs in the ceramic substrates due to the difference in the coefficient of thermal expansion between the metal and the ceramic substrates.

The invention has been made in consideration of the above circumstances, and an object of the invention is to provide a method of manufacturing a power module substrate and a power module substrate in which multilayers of ceramic substrates and metal plates are laminated, the metal plates on both sides of the ceramic substrates can be in a connected state, and, furthermore, separation between the ceramic substrate and the metal plate, cracking in the ceramic substrates, and the like do not easily arise.

In a method in which metal plates are bonded to ceramic substrates through brazing like the power module substrate as described in Patent Document 1, in a case in which penetration holes are formed in the ceramic substrates, and the metal plates on both sides of the ceramic substrates are in a connected state through the inside of the penetration holes, disposing metallic members for connection in the penetration holes and brazing the members to both metal plates can be considered. However, the ceramic substrate is a sintered part, and has a significantly large dimensional tolerance compared to the metallic members due to the influence of shrinkage during sintering. Therefore, in a method in which metal parts are inserted in the penetration holes formed in the ceramic substrates, and brazed to both metal plates, it is difficult to stably bond the metal plates to the ceramic substrates due to variation in the dimensional difference between the length of the metallic members and the thickness of the ceramic substrate. Based on the above perception, the invention has employed the following solutions.

The method of manufacturing a power module substrate of the invention is a method of manufacturing a power module substrate in which a plurality of ceramic substrates and metal plates are alternately laminated, and bonded, and the metal plates on both sides of the ceramic substrates are in a connected state through penetration holes formed in the ceramic substrate, in which, when the ceramic substrates and the metal plates are laminated, columnar metallic members that are longer than the penetration holes are inserted into the penetration holes in the ceramic substrates, and, when the ceramic substrates and the metal plates are bonded, the metallic members are pressurized and plastically deformed so that the metal plates on both sides of the ceramic substrates are bonded through the metallic members.

By plastically deforming the metallic member inserted in the penetration hole in the ceramic substrate so as to bond both metal plates, it is possible to adjust dimensional variation of the thickness of the ceramic substrate in accordance with the plastic deformation amount of the metallic member, and to stably bond the metal plates to the ceramic substrates. Therefore, occurrence of thermal stress is reduced, and occurrence of separation, cracking, and the like is prevented.

Meanwhile, in the manufacturing method of the invention, the metal plates are desirably bonded in a state in which an interspace is formed between the metallic member and the inner circumferential surface of the penetration hole. Since an interspace is formed between the metallic member and the inner circumferential surface of the penetration hole, and the penetration hole is not filled with metal, it is possible to absorb the difference in the coefficient of thermal expansion between the metallic member and the ceramic substrate using the interspace even when the metallic member is thermally expanded and shrunk repeatedly due to a temperature cycle.

In the manufacturing method of the invention, the metallic member may be integrally provided in advance on the surface of one of both metal plates that are disposed on both sides of the ceramic substrate. In this case, the metallic member is bonded to the other metal plate.

Alternately, the metallic member may be integrally provided in advance on the respective surfaces of both metal plates that are disposed on both sides of the ceramic substrate. In this case, the metallic member is composed of two members, the members are provided at both metal plates respectively, and bonded at a middle location of the length of the penetration hole.

Furthermore, as an alternative method, the metallic member may have end surfaces at both ends in the longitudinal direction, and the end surfaces may be bonded to both metal plates disposed on both sides of the ceramic substrate respectively.

The power module substrate of the invention is a power module substrate in which a plurality of ceramic substrates and metal plates are alternately laminated, and bonded, and the metal plates on both sides of the ceramic substrates are in a connected state through the insides of penetration holes formed in the ceramic substrate, in which the metal plates on both sides of the ceramic substrates are bonded in a state in which metallic members inserted in the penetration holes are plastically deformed.

In addition, the power module substrate of the invention desirably may have interspaces formed between the metallic members and an inner circumferential surfaces of the penetration holes.

Advantage of the Invention

According to the invention, it is possible to adjust dimensional variation of the thickness of the ceramic substrate in accordance with the plastic deformation amount of the metallic member, and to stably bond the metal plates to the ceramic substrates. In addition, in a case in which interspaces are formed between the inner circumferential surfaces of the penetration holes and the metallic members, occurrence of thermal stress caused by the difference in the coefficient of thermal expansion between the metallic member and the ceramic substrate is reduced, and occurrence of separation, cracking, and the like is prevented even when the metallic members are thermally expanded and shrunk repeatedly due to a temperature cycle. Thereby, it is possible to produce a multilayered power module substrate that is highly reliable in terms of bonding for a long period of time.

BEST MODE FOR CARRYING OUT THE INVENTION

Hereinafter, an embodiment of the invention will be described with reference to the accompanying drawings.

First Embodiment

FIGS. 1 to 5 show a power module substrate of a first embodiment. In the power module substrate 1, a plurality of ceramic substrates 2 and 3, and metal plates 4A to 4E, 5A, 5B, and 6 are alternately laminated, and bonded to each other through brazing, an electronic part 7 is mounted on a part of the metal plates 4A to 4E (4D and 4E in the shown example) disposed at the top step, and a heat sink 8 is bonded to the metal plate 6 disposed at the bottom step.

Figure 4:
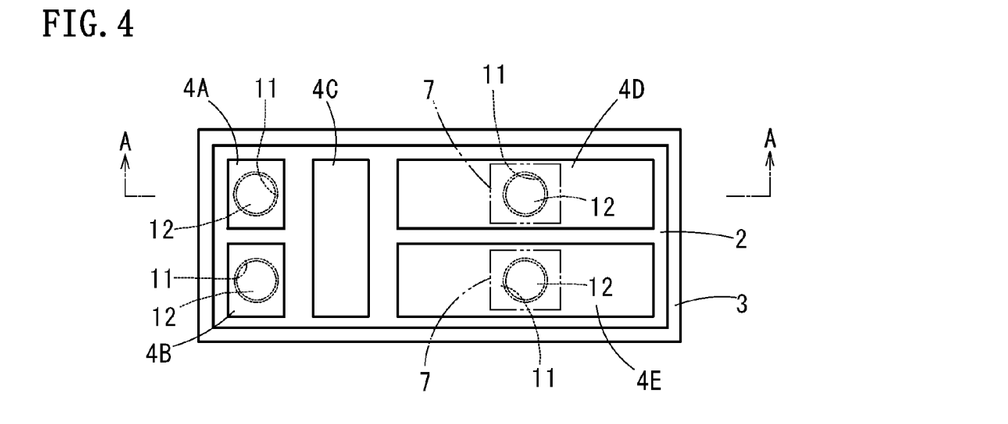
FIG. 4 is a plane view of the power module substrate of FIG. 1.
Figure 5:
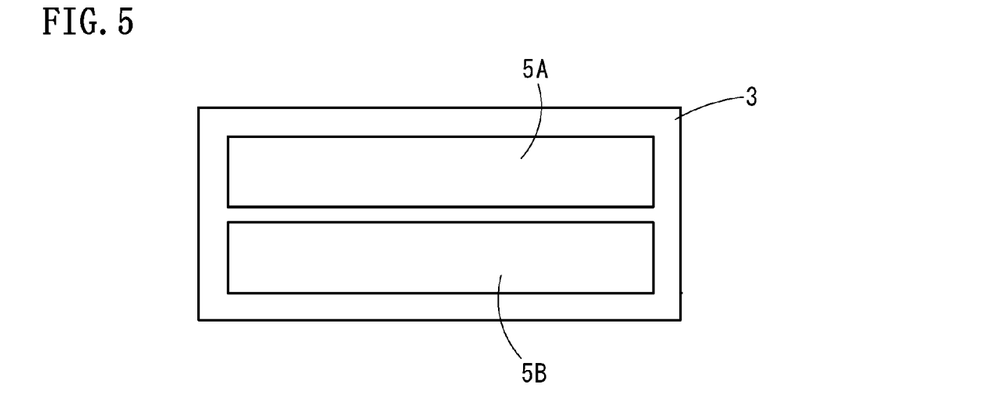
FIG. 5 is an arrow view taken along the line B-B in FIG. 1.

In the shown example, two ceramic substrates 2 and 3 are used, and the metal plates 4A to 4E, 5A, 5B, and 6 are disposed so as to form three layers. The number of the metal plates 4A to 4E, 5A, 5B, and 6 is five sheets at the top step, two sheets between both ceramic substrates, and one sheet at the bottom step respectively. Of the five metal plates 4A to 4E on the top step, one plate (4C) is disposed at the middle location, and two plates (4A and 4B, and 4D and 4E) are disposed at each of both sides. The metal plates (5A and 5B) between both ceramic substrates 2 and 3 (hereinafter referred to as the middle metal plate) are formed into a thin and long band shape that is long enough to couple the metal plates 4A and 4D and the metal plates 4B and 4E respectively, which are disposed at both side locations of the top step, as shown in FIGS. 4 and 5, and the two plates are disposed in parallel. In addition, a set of the metal plates 4A and 4D and a set of the metal plates 4B and 4E, which are disposed at both sides on the top step, are in an electrically connected state through the metal plates 5A and 5B on the middle step so as to be coupled below the metal plate 4C at the middle location.

Figure 1:
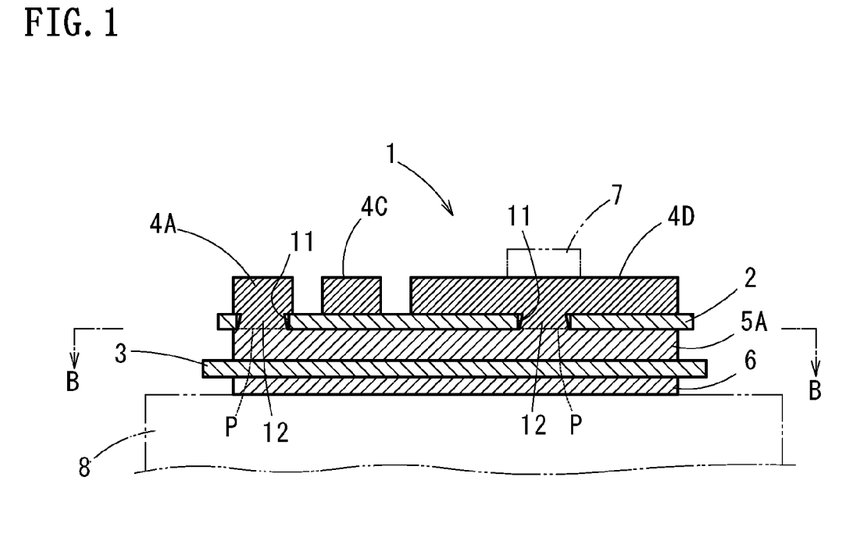
FIG. 1 is a vertical cross-sectional view showing a first embodiment of a power module substrate of the invention, which is equivalent to a sectional view taken along line A-A in FIG. 4.
Figure 2:
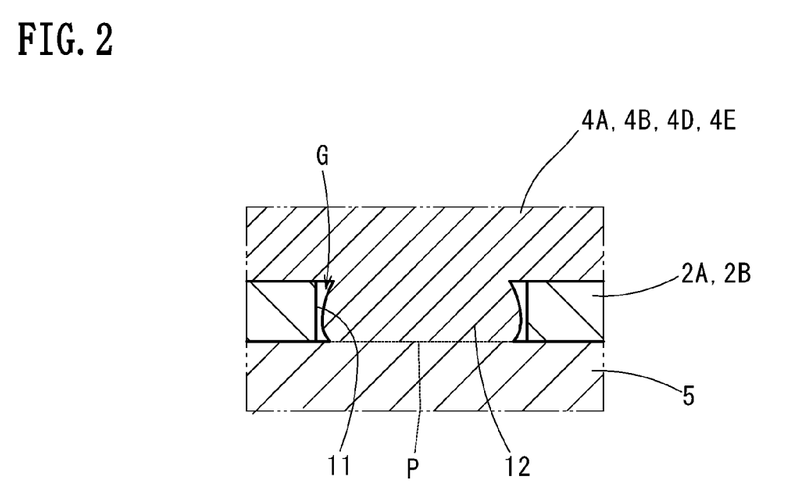
FIG. 2 is an enlarged cross-sectional view showing the vicinity of a bonding portion in FIG. 1.

As the connection form, four penetration holes 11 are formed in the ceramic substrate 2, and a protrusion portion 12 (equivalent to the metallic member of the invention) is integrally formed into a cylindrical shape on one surface of each of four metal plates 4A, 4B, 4D, and 4E, excluding the metal plate 4C at the middle location, of the five metal plates 4A to 4E on the top step, the protrusion portions 12 are inserted into the respective penetration holes 11, and bonded to the metal plates 5A and 5B on the middle step between both ceramic substrates 2 and 3. In this case, the protrusion portion 12 are bonded to the metal plates 5A and 5B on the middle step, and the intermediate vicinities between the bonding portions P of the metal plates 5A and 5B on the middle step and the bottom surfaces of the metal plates 4A, 4B, 4D, and 4E plastically deform so as to develop a state in which the diameters are slightly expanded as described below, but interspaces G are formed between the inner circumferential surfaces of the penetration holes 11 and the protrusion holes.

The ceramic substrates 2 and 3 are formed of AlN, Al$_2$O$_3$, SiC, or the like into a thickness of, for example, 0.32 mm to 1.0 mm, the metal plates 4A to 4E, 5A, 5B, and 6 are formed of pure aluminum or an aluminum alloy into a thickness of, for example, 0.25 mm to 2.5 mm, and an Al—Si-based or Al—Ge-based brazing material is used as the brazing material that can bond the ceramic substrates and the metal plates.

Next, a method of manufacturing the power module substrate 1 as configured above will be described.

Of the ceramic substrates 2 and 3, the ceramic substrate 2 having the penetration holes 11 can be produced by forming the penetration holes in an unfired green sheet of a ceramic through a pressing process, and then firing the green sheet. The outer shape is processed after firing. The outer shape of the ceramic substrate 3 having no penetration hole is processed after a green sheet is fired.

The metal plates 4C, 5A, 5B, and 6 are produced as metal plates having a brazing foil attached thereto by temporarily fixing a brazing foil 13 (refer to FIG. 3) to the surface using a volatile organic medium, such as octanediol, or the like, and integrally punching out the brazing foil through a pressing process. In this case, the brazing foil is attached to the metal plate 4C on the top step and the metal plate 6 on the bottom step, and the brazing foils are attached to both surfaces of the metal plates 5A and 5B on the middle step.

In addition, of the metal plates 4A to 4E on the top step, the metal plates 4A, 4B, 4D, and 4E having the protrusion portion 12 are formed by forming the protrusion portions 12 on a surface in advance through a pressing process, and attaching a brazing foil in which an opening is made so as to remove the corresponding portion of the protrusion portion 12 to the plane in the vicinity of the protrusion portion 12.

Figure 3:
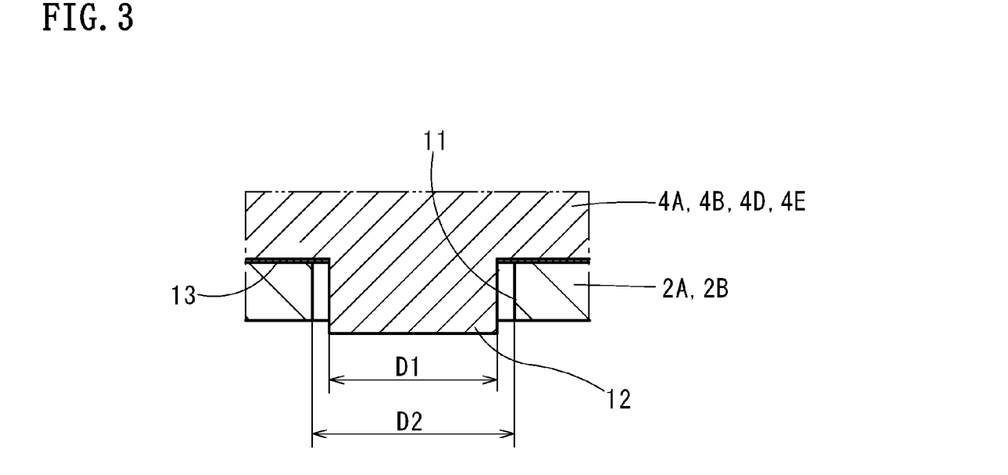
FIG. 3 is the same enlarged cross-sectional view as FIG. 2 showing a dimensional relationship between a penetration hole in a ceramic substrate and a protrusion portion in a metal plate before bonding.

The protrusion portion 12 as formed in the above manner is larger than the thickness of the ceramic substrate 2 having the penetration holes 11, and is set to have a length that slightly protrudes from the ceramic substrate 2 when inserted into the penetration hole 11 as shown in FIG. 3. Considering the dimensional variation of the thickness of the ceramic substrate 2, the length is set to 0.02 mm to 0.2 mm larger than the maximum value of the tolerance, for example, 0.05 mm. In addition, with regard to the outer diameter D1 of the protrusion portion 12 and the inner diameter D2 of the penetration hole 11 in the ceramic substrate 2, since the diameter of the protrusion portion 12 is expanded during pressurization as described below, the outer diameter D1 of the protrusion portion 12 is formed to be 1.0 mm to 20 mm, and the inner diameter D2 of the penetration hole 11 in the ceramic substrate 2 is formed to be 1.1 mm to 28 mm so that the interspace G is formed even in a state in which the diameter is expanded. For example, the outer diameter D1 of the protrusion portion 12 is made to be 10 mm, and the inner diameter D2 of the penetration hole 11 is made to be 13 mm.

Figure 6:
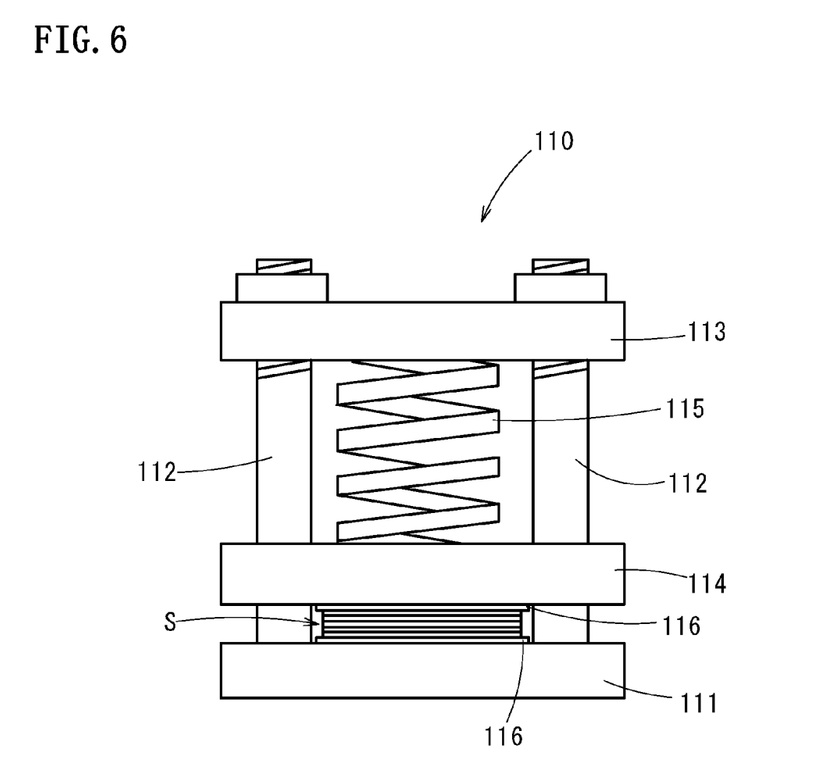
FIG. 6 is a front view showing an example of a pressurizing apparatus that is used in a manufacturing method of the invention.

The ceramic substrates 2 and 3 as formed in the above manner and the metal plates 4A to 4E, 5A, 5B, and 6 are alternately overlapped, the protrusion portions 12 on the metal plates 4A, 4B, 4D, and 4E are inserted into the corresponding penetration holes 11 in the ceramic substrate 2, and the laminate S is installed in a pressurizing apparatus as shown in FIG. 6.

The pressurizing apparatus 110 has a base plate 111, guide posts 112 that are vertically mounted to the top surface of the base plate 111 at four corners, a fixing plate 113 fixed to the top end portions of the guide posts 112, a pressing plate 114 that can move upward and downward between the base plate 111 and the fixing plate 113, and is supported by the guide posts 112, and a biasing unit 115 that is provided between the fixing plate 113 and the pressing plate 114 and biases the pressing plate 114 downward, such as a spring.

The fixing plate 113 and the pressing plate 114 are disposed in parallel with the base plate 111, and the laminate S is disposed between the base plate 111 and the pressing plate 114. Carbon sheets 116 are provided on both surfaces of the laminate S in order to equalize pressurizing.

In a state in which the laminate is pressurized using the pressurizing apparatus 110, the pressurizing apparatus 110 is installed in a heating furnace, not shown, and heated to a brazing temperature of, for example, 630° C. so as to braze the laminate.

Figure 7:
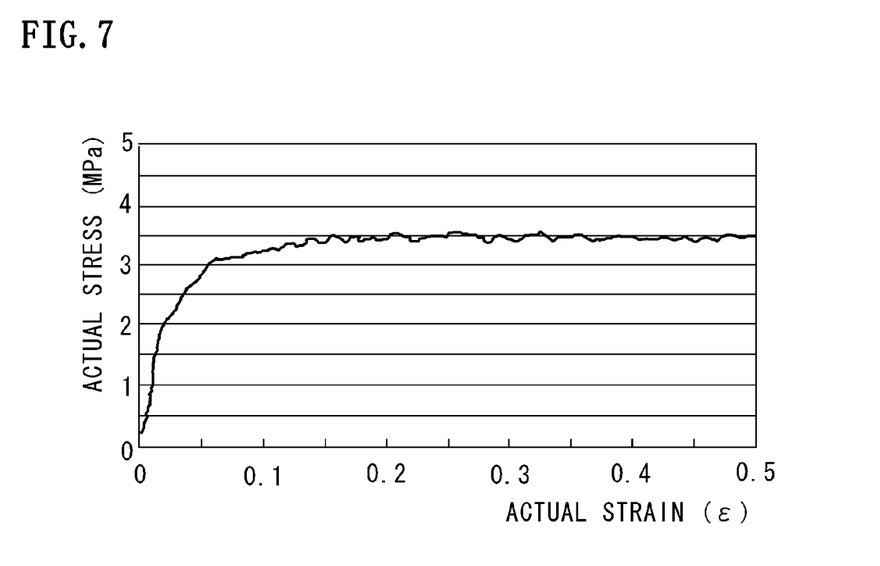
FIG. 7 is a diagrammatic view of the actual stress and actual strain of the metal plate.

The biasing force of the biasing unit 115 is set in advance so that a load of the yield point or more is exerted on the protrusion portions 12 on the metal plates 4A, 4B, 4D, and 4E during the brazing. FIG. 7 is a diagrammatic view of the actual stress and actual strain of aluminum having a purity of 99.99% by mass in the vicinity of 630° C., in which the aluminum yields at approximately 3.5 MPa. Therefore, for example, when the outer diameter D1 of the protrusion portion 12 is set to 10 mm, the biasing force of the biasing unit 115 at room temperature is set so that a load of 270 N or more is exerted on the protrusion portion 12 at a high temperature of 630° C.

When the biasing force is set in the above manner, the protrusion portions 12 plastically deform so as to be pressed during the brazing, and are bonded to the metal plates 5A and 5B on the middle step, and the planes of the metal plates 4A to 4E around the protrusion portions 12 come into close contact with the surface of the ceramic substrate 2, whereby a uniform bonding state in the surface direction can be achieved.

In addition, even in a state in which the substrates and the metal plates have been bonded to each other, the diameters of the protrusion portions 12 partially expand, but the interspaces G are formed between the protrusion portions 12 and the inner circumferential surfaces of the penetration holes 11 in a state in which the diameters are expanded as described above, and therefore there is no case in which the protrusion portions 12 press the inner circumferential surfaces of the penetration holes 11.

The power module substrate 1 as manufactured in the above manner is provided for use in a state in which an electronic part 7 is mounted on a part of the metal plates 4A to 4E on the top step, and the heat sink 8 is mounted on the metal plate 6 on the bottom step. Since the interspaces G are formed between the protrusion portions 12 and the inner circumferential surfaces of the penetration holes 11, thermal stresses are reduced at the portions of the penetration holes 11 even when the protrusion portions are thermally expanded and shrunk repeatedly due to a temperature cycle during use, and separation of the bonding portions, cracking in the ceramic substrates 2 and 3, and the like are prevented, whereby the power module substrate can maintain high reliability.

In addition, heat generated from the electronic part 7 that is mounted on the metal plates 4D and 4E on the top step is transmitted to the metal plates 5A and 5B on the middle step through the protrusion portions 12 from the metal plates 4D and 4E; however, in a case in which the protrusion portions 12 are disposed immediately below the electronic part 7, the heat is linearly transmitted from the metal plates 4D and 4E to the metal plates 5A and 5B on the middle step through the protrusion portions 12 so that the heat can be rapidly dissipated. A large outer diameter D1 of the protrusion portion 12 is preferred in order to enhance the heat-releasing properties, and, for example, if the transverse area is larger than the projected area of the electronic part 7, excellent heat-releasing properties are exhibited when the electronic part 7 is mounted on the extended imaginary area of the protrusion portions 12. In addition, since a large electric current flows in the power module substrate, the protrusion portion 12 having a large cross-sectional area is preferred since the electric current density is decreased.

Meanwhile, in a case in which a circuit is configured to be divided by the plurality of metal plates 5A and 5B on the middle step as shown in FIG. 5, a method in which molten metal is fed as described in Patent Document 2 has a difficulty in manufacturing a power module substrate; however, in the method of the invention, it is possible to easily manufacture an aspect in which a circuit is divided by the metal plates on the middle step.

Second Embodiment

Figure 8:
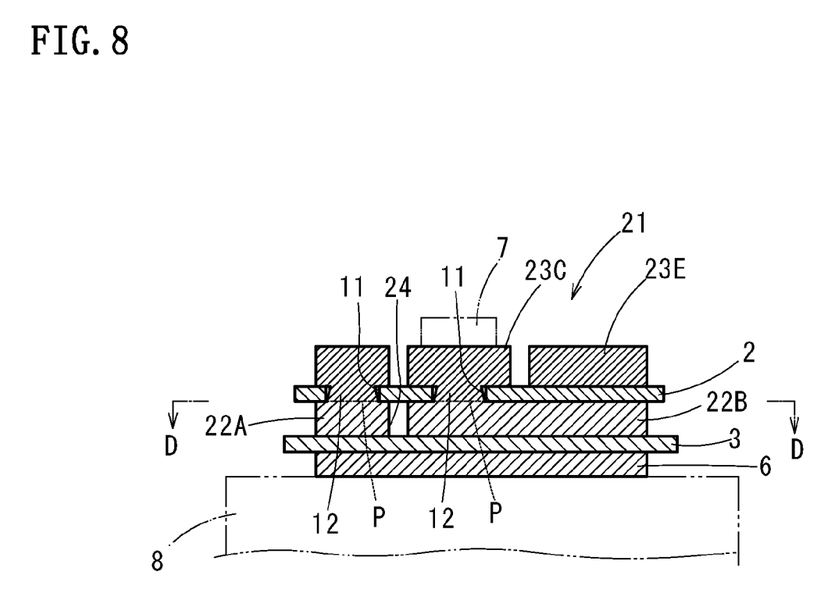
FIG. 8 is a vertical cross-sectional view showing a second embodiment of the power module substrate of the invention, which is equivalent to a sectional view taken along line C-C in FIG. 10.
Figure 9:
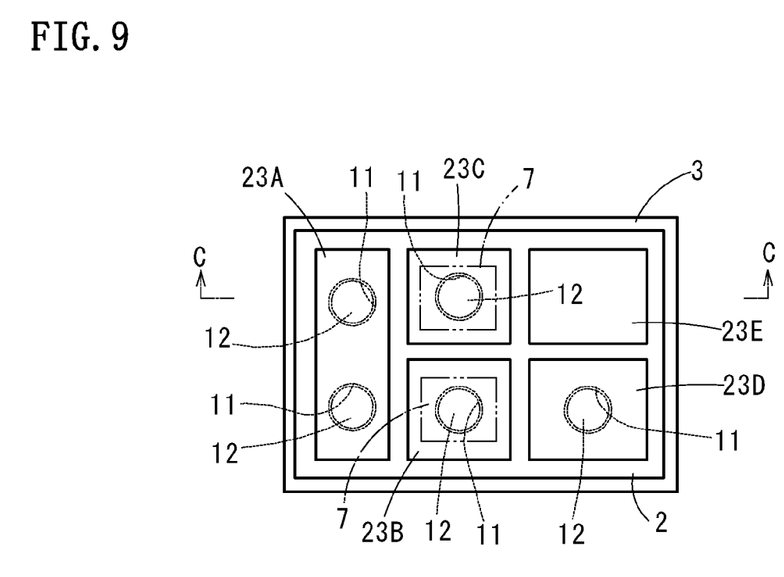
FIG. 9 is a plane view of the power module substrate of FIG. 8.
Figure 10:
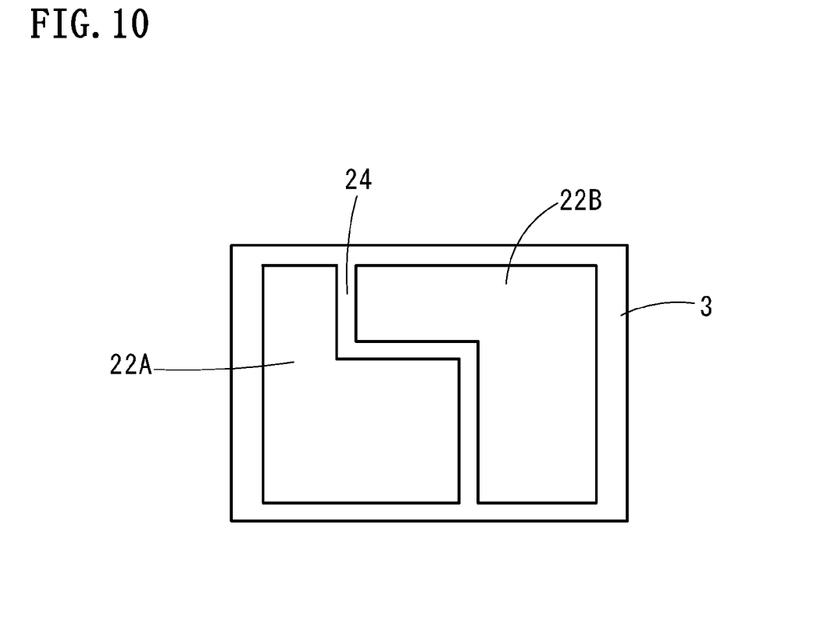
FIG. 10 is a sectional view taken along line D-D in FIG. 8.

FIGS. 8 to 10 show a power module substrate of a second embodiment of the invention.

In the power module substrate 21, the fact that two ceramic substrates and three layers of metal plates form a laminate structure is the same as in the first embodiment, but metal plates 22A and 22B on the middle step, which are disposed between both ceramic substrates 2 and 3, are flexurally molded into an L shape when viewed on a plane, and the flexural portions are arranged so as to face each other.

On the top step, five metal plates 23A to 23E are disposed, two sets of two metal plates (23A and 23B, and 23C and 23D) out of the five metal plates are in a state of being electrically connected to each other through the metal plates 22A and 22B on the middle step, and the connection structure is the same as in the first embodiment, which will not be described.

In the power module substrate 21 of the second embodiment, since the metal plate 22A and 22B on the middle step, which are disposed between both ceramic substrates 2 and 3, are arranged with the flexural portions facing each other, a hollow portion 24 formed by the ceramic substrates 2 and 3 and the metal plates 22A and 22B is flexurally formed into a crank shape. Therefore, the power module substrate cannot be manufactured by the method described in Patent Document 2 in which molten metal is fed. According to the method of the invention, since the number and shape of the metal plates 22A and 22B that are disposed between the ceramic substrates 2 and 3 can be arbitrarily set, the method has a high degree of freedom in designing, and is advantageous for an increase in integration.

Third Embodiment

Figure 11:
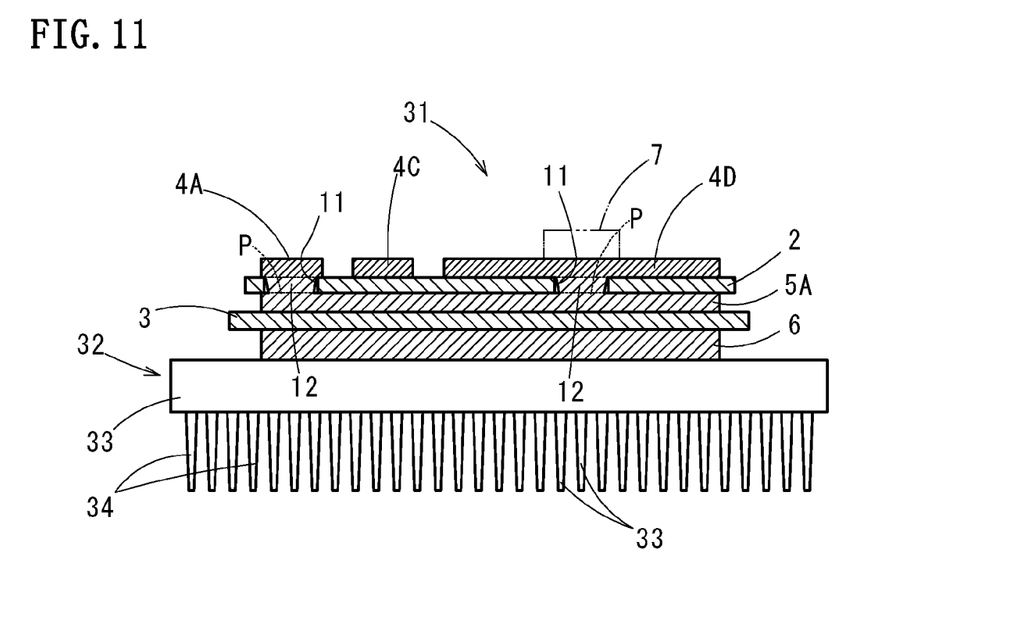
FIG. 11 is the same vertical cross-sectional view as FIG. 1 showing a third embodiment of the power module substrate of the invention.
Figure 12:
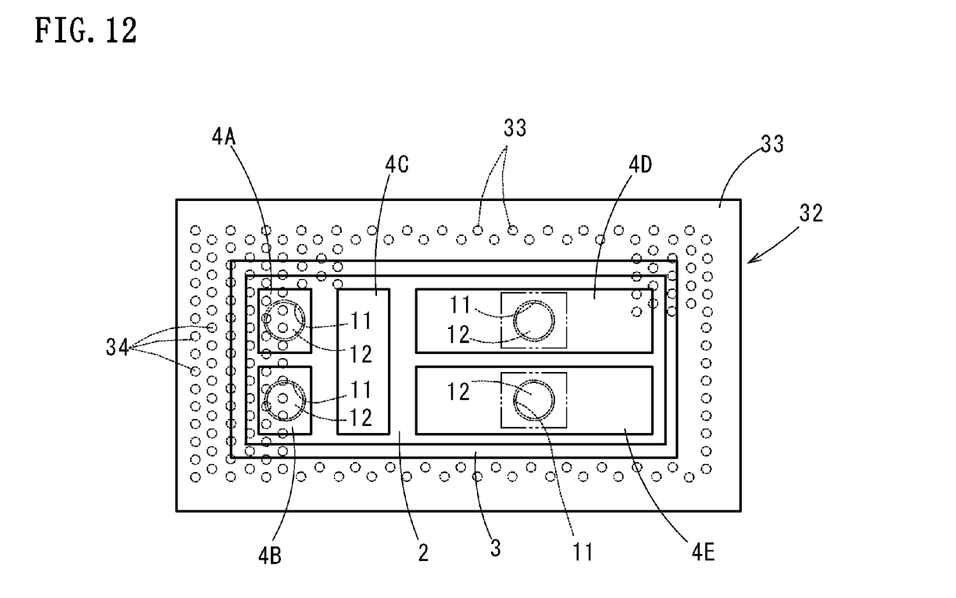
FIG. 12 is a plan view of the power module substrate of FIG. 11.
Figure 13:
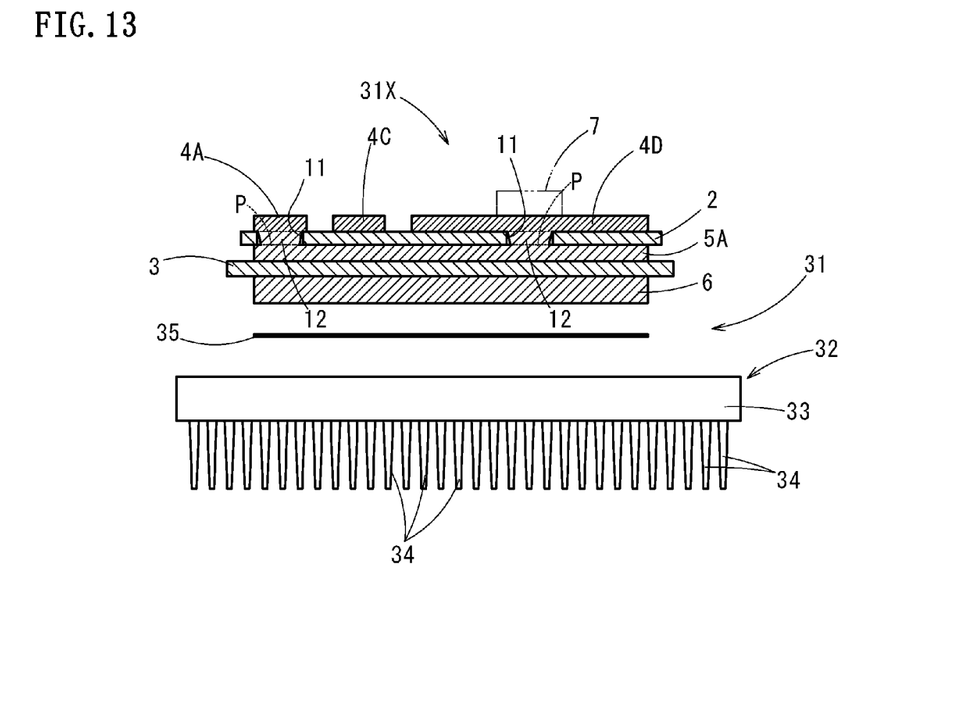
FIG. 13 is a vertical cross-sectional view showing a state of a fourth embodiment of the power module substrate of the invention pending assembly.

FIGS. 11 to 13 show a power module substrate of a third embodiment of the invention.

In the power module substrate 31, the two ceramic substrates 2 and 3 and three layers of the metal plates 4A to 4E, 5A, 5B, and 6 form a laminate structure, and a pin fin-heat sink 32 is bonded to the metal plate 6 on the bottom step. The same portions as in the first embodiment will be given the same reference numbers in the respective drawings in the following description.

The two ceramic substrates 2 and 3 are formed of AlN, $Al_2O_3$, SiC, or the like into a thickness of, for example, 0.635 mm, and three layers of the metal plates 4A to 4E, 5A, 5B, and 6 are formed of pure aluminum having a purity of 99.99% by mass (4N) into a thickness of, for example, 0.5 mm for the metal plates 4A to 4E that compose a circuit layer on the top step, 0.5 mm for the metal plates 5A and 5B on the middle layer, and 2 mm for the metal plate 6 on the bottom layer. In addition, the protrusion portions 12 are integrally formed on the top surface of the metal plates 5A and 5B in the middle layer, the protrusion portions 12 are inserted into the penetration holes 11 formed in the ceramic substrate 2, and bonded to the metal plates 4A to 4E on the top step.

On the heat sink 32, a number of pin-shaped fins 34 are integrally formed on a single surface of a plate-shaped portion 33 through hot forging of, for example, an A6063 aluminum alloy. There is no dimensional limitation, for example, the plate-shaped portion 33 is formed into a 50 mm×50 mm×5 mm square plate, the respective fins 34 are formed into a diameter of 3 mm and a height of 15 mm, and arrayed in a zigzag shape having a pitch of 6 mm.

In order to manufacture a power module substrate 31 having the above structure, the ceramic substrates 2 and 3 are manufactured by firing a green sheet by the same method as in the first embodiment, and the respective metal plates 4A to 4E, 5A, 5B, and 6 are punched out through a pressing process. In addition, the heat sink 32 having the plate-shaped portion 33 and the fins 34 integrally molded therein is manufactured by hot forging. In the respective metal plates, a brazing foil is attached to the rear surfaces of the metal plates 4A to 4E on the top step and both surfaces of the metal plates 5A and 5B in the middle layer.

In addition, two ceramic substrates 2 and 3, and three layers of the metal plates 4A to 4E, 5A, 5B, and 6 are first bonded (primary bonding), and then the heat sink 32 is bonded (secondary bonding).

In the first bonding, three layers of the metal plates 4A to 4E, 5A, 5B, and 6 and the two ceramic substrates 2 and 3 are alternately laminated, the protrusion portions 12 on the metal plates 5A and 5B are inserted into the penetration holes 11 in the ceramic substrate 2, and, similarly to the first embodiment, the laminate is installed in the pressurizing apparatus 11 as shown in FIG. 6 and pressurized. As the brazing foil that is attached to the metal plates 4A to 4E, 5A, 5B, and 6, for example, a 15 μm-thick brazing foil composed of Al—7.5% by mass Si is used. The laminate in a pressurized state is heated under vacuum so as to be brazed. The heating temperature is, for example, 630° C., the pressuring force is, for example, 0.5 MPa (5 kg/cm$^2$), and a load of 3.5 MPa or more is exerted on the protrusion portions 12 at a high temperature of 630° C.

Due to the first bonding, the protrusion portions 12 formed on the metal plates 5A and 5B in the middle layer are plastically deformed and bonded to the metal plates 4A to 4E on the top step, and the metal plates 4A to 4E, 5A, and 5B on both layers are in a connected state through the penetration holes 11 in the ceramic substrate 2. Even in this case, an interspace is formed between the outer circumferential surface of the protrusion portion 12, the diameter of which is expanded due to the plastic deformation, and the inner circumferential surface of the penetration hole 11 in the ceramic substrate 2.

In the second bonding, the brazing foil 35 is interposed between the metal plate 6 on the bottom step in a first bonding resultant 31X and the plate-shaped portion 33 in the heat sink 32, and the assembly in a pressurized state is heated under vacuum so as to be brazed. In this case, as the brazing foil 35, a 50 μm-thick brazing foil composed of Al—10.5% by mass Si is used. The pressuring force is, for example, 0.7 MPa (7 kg/cm$^2$), and the heating temperature is, for example, 610° C. Even in this case, the same pressurizing apparatus as in FIG. 6 is used; however, since the pin-shaped fins 34 protrude from the heat sink 32, a carbon sheet having openings correspondingly disposed to the fins 34 is used as the carbon sheet that comes into contact with the heat sink 32, and the plate-shaped portion 33 in the heat sink 32 is pressed around the fins 34.

By manufacturing in the above manner, it is possible to provide the power module substrate 31 which has the metal plates 4A to 4E on the top step and the metal plates 5A and 5B on the middle layer in a connected state through the ceramic substrates 2 and 3 so as to have the same electrical characteristics as in the first embodiment, and is integrated with the heat sink 32.

Fourth Embodiment

In the third embodiment, the two ceramic substrates 2 and 3 and three layers of the metal plates 4A to 4E, 5A, 5B, and 6 are first bonded, and then the heat sink 32 is bonded; however, in a fourth embodiment, a heat sink-attached power module substrate 41 in which the ceramic substrates, the metal plates, and the heat sink are bonded at the same time is provided. In the fourth embodiment, the respective elements will have the same reference numbers as in the third embodiment for description.

Figure 14:
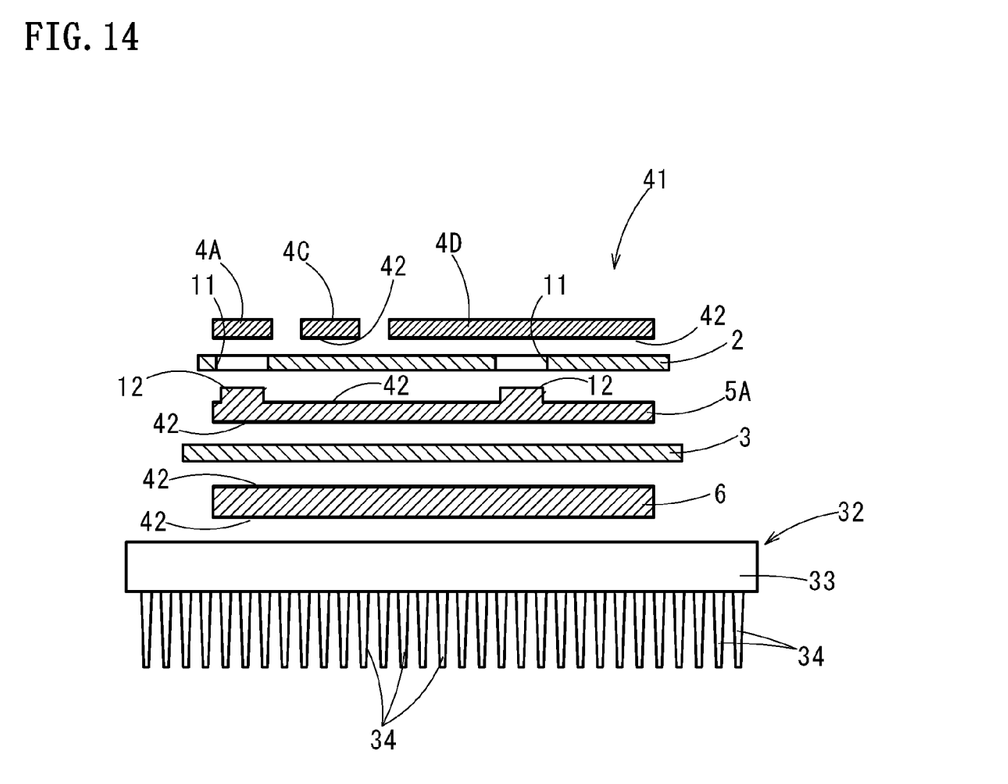
FIG. 14 is a vertical cross-sectional view showing a state of a fifth embodiment of the power module substrate of the invention before assembly.

In order to manufacture the power module substrate 41 having the above structure, the ceramic substrates 2 and 3 are manufactured by firing a green sheet by the same method as in the first embodiment, and the respective metal plates 4A to 4E, 5A, 5B, and 6 are punched out through a pressing process. In addition, the heat sink 32 integrated with the plate-shaped portion 33 and the fins 34 is manufactured through hot forging. In the metal plates 4A to 4E, 5A, 5B, and 6, as shown in FIG. 14, approximately 0.4 μm-thick copper layers 42 are formed through deposition or the like respectively on the bonding surface of the ceramic substrates 2 and 3, and the bonding surface of the heat sink 32, that is, the rear surfaces of the metal plates 4A to 4E on the top step, the plane portions on both surfaces of the metal plates 5A and 5B in the middle layer, excluding the protrusion portions 12, and both surfaces of the metal plate 6 on the bottom step.

In addition, the respective metal plates 4A to 4E, 5A, 5B, and 6 and the ceramic substrates 2 and 3 are alternately laminated on the top surface of the plate-shaped portion 33 in the heat sink 32, the assembly is in a state in which the protrusion portions 12 on the metal plates 5A and 5B are inserted into the penetration holes 11 in the ceramic substrate 2, installed in the same pressurizing apparatus 110 as in FIG. 6, and pressurized. As described in the third embodiment, a carbon sheet having openings correspondingly disposed to the fins 34 is used as the carbon sheet that comes into contact with the heat sink 32, and the plate-shaped portion 33 in the heat sink 32 is pressed around the fins 34. The pressuring force is, for example, 0.6 MPa (6 kg/cm$^2$), and a load at which the protrusion portion 12 yield or more is exerted at a high temperature of 600° C. Three layers of the metal plates 4A to 4E, 5A, 5B, and 6, the two ceramic substrates 2 and 3, and the heat sink 32 are bonded at the same time by heating the assembly at 600° C. for 0.5 hours under vacuum of 10$^{-3}$ Pa to 10$^{-6}$ Pa in the pressurized state. The above bonding method is a transient liquid phase bonding method termed transient liquid phase diffusion bonding (TLP bonding method).

In the transient liquid phase bonding method, the copper layers 42 deposited on the surfaces of the metal plates 4A to 4E, 5A, 5B, and 6 are interposed in the interfaces among the metal plates 4A to 4E, 5A, 5B, and 6, the ceramic substrates 2 and 3, and the heat sink 32. The copper first diffuses into the aluminum of the metal plates 4A to 4E, 5A, 5B, and 6 through heating, and the concentration of the copper in the vicinity of the copper layers on the metal plates 4A to 4E, 5A, 5B, and 6 increases so as to decrease the melting point, whereby a molten metal phase is formed in the bonding interfaces in the eutectic range between aluminum and copper. When the temperature is held constant in a state in which the molten metal phase is formed, the molten metal phase comes into contact and reacts with the ceramic substrates 2 and 3 or the heat sink 32 at a certain temperature for a certain time, as the copper further diffuses into the aluminum, the concentration of copper in the molten metal phase gradually decreases so as to increase the melting point, and the molten metal phase is solidified in a state in which the temperature is held constant. Thereby, the metal plates 4A to 4E, 5A, 5B, and 6, the ceramic substrates 2 and 3, and the heat sink 32 are strongly bonded, and cooled to room temperature after the molten metal phase is fully solidified.

Due to the pressuring force in the above transient liquid phase bonding method, the protrusion portions 12 formed on the metal plates 5A and 5B in the middle layer also plastically deform, and are bonded to the metal plates 4A to 4E on the top step so that both metal plates 4A to 4E, 5A, and 5B are in a connected state through the penetration holes 11 in the ceramic substrate 2. Even in this case, an interspace is formed between the outer circumferential surface of the protrusion portion 12, the diameter of which is expanded due to the plastic deformation, and the inner circumferential surface of the penetration hole 11 in the ceramic substrate 2.

In addition, the metal plates 4A to 4E on the top step and the metal plates 5A and 5B in the middle step are in a connected state through the ceramic substrate 2, and, similarly to the third embodiment, the power module substrate 41 integrated with the heat sink 32 can be provided.

According to the manufacturing method, the ceramic substrates 2 and 3, the respective metal plates 4A to 4E, 5A, 5B, and 6, and the heat sink 32 can be bonded at one stroke, and the efficiency of assembling operation is favorable.

Fifth Embodiment

Figure 15:
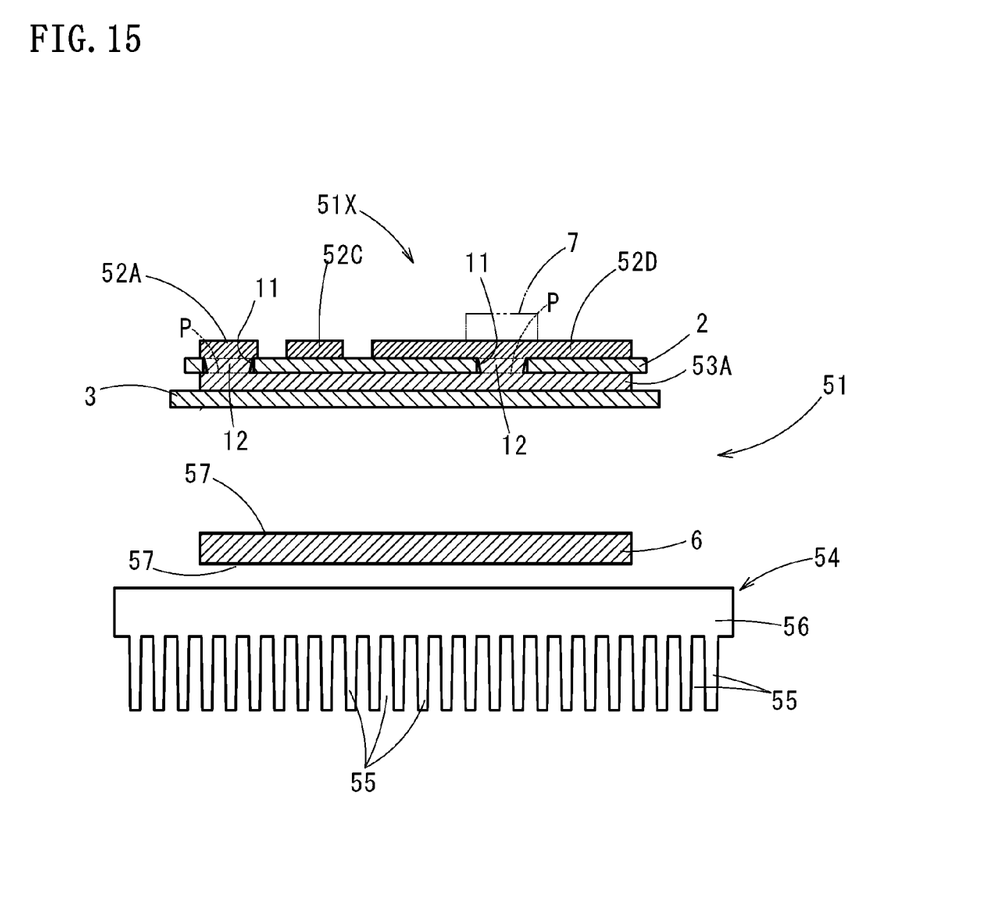
FIG. 15 is a vertical cross-sectional view showing a state of a sixth embodiment of the power module substrate of the invention pending assembly.

The respective embodiments as described above show a so-called direct brazed aluminum (DBA) substrate in which aluminum is used for the metal plates on both surfaces of the ceramic substrate as an example of the substrate; however, in a power module substrate 51 of a fifth embodiment as shown in FIG. 15, copper plates are used for metal plates 52A to 52E on the top step and metal plates 53A and 53B in the middle layer. In addition, in the example as shown in the drawing, a heat sink having straight fins 55 is used as a heat sink 54. Meanwhile, the plane shape and disposition on the plane of the respective metal plates are the same as in FIGS. 4 and 5, FIG. 15 is, similarly to FIG. 1, equivalent to a cross-sectional view taken along the line A-A in FIG. 4, and shows the metal plates 52A, 52C, 52D, and 53A of the respective metal plates 52A to 52E, 53A, and 53B.

For the metal plates 52A to 52E, 53A, and 53B on the top step and in the middle layer, for example, 0.3 mm-thick tough pitch copper is used. Similarly to the respective embodiments as described above, 2.0 mm-thick 99.99% by mass pure aluminum is used for the metal plate 6 on the bottom step, and 0.635 mm-thick AlN is used for the ceramic substrates 2 and 3. The heat sink 54 is formed, for example, through extrusion molding of an A6063 aluminum alloy. In the example as shown in the drawing, the heat sink is extruded in an orthogonal direction to the paper surface, and band-shaped straight fins 55 are formed in the extrusion direction. There is no dimensional limitation, for example, a plurality of 4 mm-thick and 15 mm-high straight fins 55 are formed along the extrusion direction on a single surface of a 50 mm×50 mm×5 mm plate-shaped portion 56.

In a case in which the power module substrate 51 having the above structure is manufactured, the ceramic substrates 2 and 3 are manufactured by firing a green sheet by the same method as in the first embodiment as described above, and the respective metal plates 52A to 52E, 53A, 53B, and 6 are punched out through a pressing process. In addition, the heat sink 54 having the plate-shaped portion 56 and the fins 55 integrally formed therein is manufactured through extrusion molding.

In addition, the metal plates 52A to 52E, 53A, 53B, and 6, the ceramic substrates 2 and 3, and the heat sink 54 are bonded two times at the primary bonding and the secondary bonding. In the primary bonding, the two ceramic substrates 2 and 3 and the metal plates 52A to 52E, 53A, and 53B on the top stair and in the middle layer are laminated through a brazing material. As the brazing material, for example, an Ag—27.4% by mass Cu—2.0% by mass Ti active metal brazing material is used. The laminate having the brazing material interposed therein is pressurized using a pressurizing apparatus at a high temperature of 850° C. so that a load at which the protrusion portion 12 yields or more is exerted, and heated at 850° C. under vacuum for approximately 10 minutes.

In the primary bonding, Ti, which is an active metal in the brazing material, first diffuses into the surfaces of the ceramic substrates 2 and 3 so as to form TiN, and the metal plates 52A to 52E, 53A, and 53B are bonded through an Ag—Cu alloy. In addition, the protrusion portions 12 on the metal plates 53A and 53B in the middle layer are bonded to the metal plates 52A to 52E on the top step through the penetration holes 11 in the ceramic substrate 2 during the primary bonding.

Next, in the secondary bonding, approximately 0.4 μm-thick copper layers 57 are formed on both surfaces of the metal plate 6 that composes the bottom step through deposition or the like, laminated on the top surface of the plate-shaped portion in the heat sink, and the ceramic substrate 3 on the bottom step side of a primary bonding resultant 51X is laminated on the copper layer, and the assembly is bonded through the transient liquid phase bonding method (transient liquid phase diffusion bonding). At this time, the assembly is heated at 600° C. for 0.5 hours under vacuum of $10^{-3}$ Pa to $10^{-6}$ Pa with a pressurizing force of 98 kPa (1 kg/cm$^2$) to 3.4 MPa (3.5 kg/cm$^2$).

Sixth Embodiment

Figure 16:
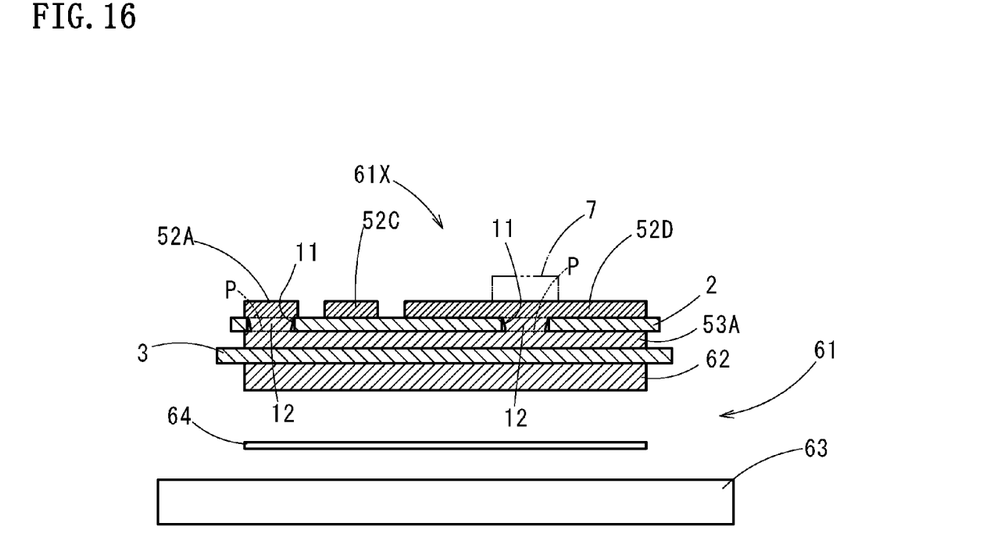
FIG. 16 is a vertical cross-sectional view showing a state of the third embodiment of the power module substrate of the invention pending assembly.

In a power module substrate 61 of a sixth embodiment as shown in FIG. 16, the metal plates 52A to 52E, 53A, 53B, and 62 are all formed of copper (for example, tough pitch copper), a heat sink 63 is also formed of copper, and the heat sink 63 and the metal plate 62 on the bottom step are bonded through soldering. Similarly to the respective embodiment, AlN is used for the ceramic substrates 2 and 3. In addition, in the example as shown in the drawing, the plate-shaped heat sink 63 is used.

In order to manufacture the power module substrate 61, two ceramic substrates 2 and 3, and three layers of the metal plates 52A to 52E, 53A, 53B, and 62 are first bonded through active metal bonding (primary bonding), and then the heat sink 63 is bonded (secondary bonding).

In the primary bonding, as the brazing material, for example, an Ag—27.4% by mass Cu—2.0% by mass Ti active metal brazing material is used, a laminate of the metal plates and the ceramic substrates is pressurized at a high temperature of 850° C. so that a load at which the protrusion portion 12 yields or more is exerted, and heated at 850° C. under vacuum for approximately 10 minutes, whereby Ti, which is an active metal, first diffuses into the ceramic substrates 2 and 3 so as to form TiN, and the metal plates 52A to 52E, 53A, 53B, and 62 are bonded through an Ag—Cu alloy.

Next, in the secondary bonding, approximately 5 μm-thick nickel plates are formed respectively through non-electrolytic plating on the rear surface of the metal plate 62 at the bottom step of a primary bonding resultant 61X and the top surface of the heat sink 63, a 200 μm-thick soldering foil 64 composed of Sn—3.5% by mass Ag—0.5% by mass Cu and the like is interposed between the nickel plates, and heated to 280° C. in a reduction atmosphere using, for example, 3% hydrogen, whereby the soldering foil 64 is reflowed, cooled, and bonded.

In the power module substrate 61, since the metal plates 52A to 52E, 53A, 53B, and 62 are all formed of copper, the heat-releasing properties are excellent.

Figure 17:
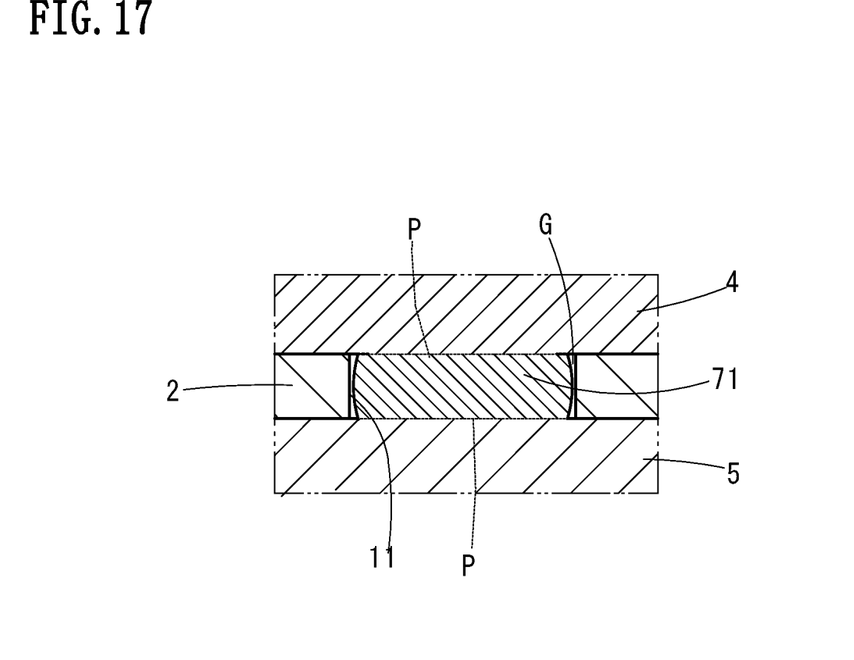
FIG. 17 is the same enlarged cross-sectional view as FIG. 2 showing the other example of the vicinity of a bonding portion.

Furthermore, the metal plate having the protrusion portion integrated formed thereon has been described as the embodiment, but a cylindrical metallic member 71 is formed separately from metal plates 4 and 5, and the metallic member 71 is disposed in the penetration hole 11 in the ceramic substrate 2 as shown in FIG. 17, whereby both end surfaces of the metallic member may be bonded to both metal plates 4 and 5. In this case, the bonding portions P are formed on both end surfaces of the metallic members 71.

Figure 18:
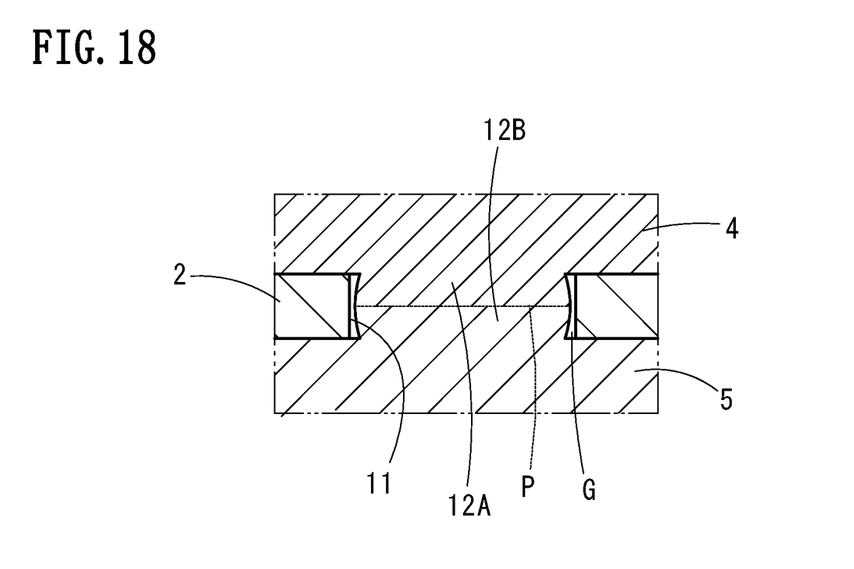
FIG. 18 is the same enlarged cross-sectional view as FIG. 2 showing another example of the vicinity of the bonding portion.

Furthermore, a configuration in which protrusion portions (metallic members) 12A and 12B are respectively formed on both metal plates 4 and 5, and bonded in the middle location of the length of the penetration hole 11 in the ceramic substrate 2 as shown in FIG. 18 may be employed. In this case, the bonding portions P are formed in the middle location in the penetration hole 11.

In addition, when the metallic member is formed into a polygonal cylindrical shape on a horizontal cross section instead of the cylindrical shape, and the penetration hole is also made to have the same polygonal shape, it is possible to prevent the metallic member from rotating in the penetration hole, and to ease alignment of the metal plates when a multilayer structure is employed.

In addition, a structure of two ceramic substrates and three layers of metal plates has been employed in the respective embodiments, the structure is not limited thereto, and the metal plates may be laminated between three or more ceramic substrates.

Furthermore, in the present specification, not only fins-attached types, such as pin fins and straight fins, but also plate-shaped types termed a heat dissipation plate are all defined as the heat sink.

DESCRIPTION OF REFERENCE NUMERALS AND SIGNS

1 POWER MODULE SUBSTRATE
2, 3 CERAMIC SUBSTRATE
4, 5, 4A TO 4E, 5A, 5B, 6 METAL PLATE
7 ELECTRONIC PART
8 HEAT SINK
11 PENETRATION HOLE
12, 12A, 12B PROTRUSION PORTION (METALLIC MEMBER)
21 POWER MODULE SUBSTRATE
22A, 22B, 23A TO 23E METAL PLATE
24 HOLLOW PORTION
31 POWER MODULE SUBSTRATE
31X FIRST BONDING RESULTANT
32 HEAT SINK
33 PLATE-SHAPED PORTION
34 FIN
35 BRAZING FOIL
41 POWER MODULE SUBSTRATE
42 COPPER LAYER
51 POWER MODULE SUBSTRATE
52A TO 52E, 53A, 53B METAL PLATE
54 HEAT SINK
55 FIN
61 POWER MODULE SUBSTRATE
61X FIRST BONDING RESULTANT
62 METAL PLATE
63 HEAT SINK
71 METALLIC MEMBER

The invention claimed is:

1. A method of manufacturing a power module substrate in which a plurality of ceramic substrates and metal plates are alternately laminated, and bonded, and the metal plates on both sides of the ceramic substrates are in a connected state through penetration holes formed in the ceramic substrate,
wherein, when the ceramic substrates and the metal plates are laminated, columnar metallic members that are longer than the penetration holes are inserted into the penetration holes in the ceramic substrate, and,
when the ceramic substrates and the metal plates are bonded by brazing or transient liquid phase bonding, the ceramic substrates and the metal plates are heated and pressurized, and the metallic members are pressurized with a load of a yield point thereof or more and plastically deformed so that the metal plates on both sides of the ceramic substrates are bonded through the metallic members with interspaces formed between the metallic members and the inner circumferential surfaces of the penetration holes.

2. The method of manufacturing a power module substrate according to claim 1,
wherein the metallic members are integrally provided in advance on the surface of one of both metal plates that are disposed on both sides of the ceramic substrate.

3. The method of manufacturing a power module substrate according to claim 1,
wherein the metallic members are integrally provided in advance on the respective surfaces of both metal plates that are disposed on both sides of the ceramic substrate.

4. The method of manufacturing a power module substrate according to claim 1,
wherein the metallic member has end surfaces at both ends in the longitudinal direction, and the end surfaces are bonded to both metal plates disposed on both sides of the ceramic substrate respectively.

5. The method of manufacturing a power module substrate according to claim 1,
wherein the metallic members are integrally provided in advance on the surface of one of both metal plates that are disposed on both sides of the ceramic substrate.

6. The method of manufacturing a power module substrate according to claim 1,
wherein the metallic members are integrally provided in advance on the respective surfaces of both metal plates that are disposed on both sides of the ceramic substrate.

7. The method of manufacturing a power module substrate according to claim 1,
wherein the metallic member has end surfaces at both ends in the longitudinal direction, and the end surfaces are bonded to both metal plates disposed on both sides of the ceramic substrate respectively.

8. A power module substrate in which a plurality of ceramic substrates and metal plates are alternately laminated, and bonded, and the metal plates on both sides of the ceramic substrates are in a connected state through insides of penetration holes formed in the ceramic substrate,
wherein the metal plates on both sides of the ceramic substrates are bonded by brazing or transient liquid phase bonding in a state in which metallic members inserted in the penetration holes are plastically deformed, and interspaces are formed between the metallic members and inner circumferential surfaces of the penetration holes.

9. A method of manufacturing a power module substrate in which at least one ceramic substrate has a first metal plate on a first side of the at least one ceramic substrate and a second metal plate on a second side of the at least one ceramic substrate, the method comprising the steps of:
forming at least one penetrating hole in the ceramic substrate and at least one metallic member on the first metal plate, wherein the at least one metallic member is longer than the at least one penetration hole;
inserting the at least one metallic member into the at least one penetration hole in the ceramic substrate, wherein the at least one penetration hole and the at least one metallic member are sized and configured to form interspaces therebetween before and after laminating; and
laminating the metal plates and the at least one ceramic substrate by brazing or transient liquid phase bonding so that the at least one metallic member is plastically deformed and bonds the metal plates together through the at least one penetration hole.

10. The method of manufacturing a power module substrate according to claim 9, wherein the at least one penetrating hole is circular and the at least one metallic member is columnar so that the interspaces are annular and extend across an entire length of the at least one penetrating hole.

* * * * *